United States Patent
Kush

(10) Patent No.: US 7,202,693 B1
(45) Date of Patent: Apr. 10, 2007

(54) COMBINED PICK, PLACE, AND PRESS APPARATUS

(75) Inventor: Dave W. Kush, Rancho Cordova, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/366,086

(22) Filed: Mar. 1, 2006

(51) Int. Cl.
*G01R 31/26* (2006.01)

(52) U.S. Cl. .................. 324/765; 324/760; 324/158.1

(58) Field of Classification Search .......... 324/158.1, 324/760, 765
See application file for complete search history.

(56) References Cited

U.S. PATENT DOCUMENTS

| | | | |
|---|---|---|---|
| 4,908,126 A * | 3/1990 | Willberg et al. ............ 209/573 |
| 5,177,434 A * | 1/1993 | Suzuki et al. ............... 324/755 |
| 5,184,068 A | 2/1993 | Twigg et al. |
| 5,227,717 A * | 7/1993 | Tsurishima et al. ......... 324/754 |
| 5,523,678 A * | 6/1996 | Mitsui ..................... 324/158.1 |
| 5,894,217 A * | 4/1999 | Igarashi et al. ............ 324/158.1 |
| 6,137,286 A | 10/2000 | Ho et al. |
| 6,184,047 B1 | 2/2001 | Shekar et al. |
| 6,184,675 B1 * | 2/2001 | Bannai ..................... 324/158.1 |
| 6,259,247 B1 * | 7/2001 | Bannai ..................... 324/158.1 |
| 6,279,225 B1 | 8/2001 | Martin et al. |
| 6,364,387 B1 | 4/2002 | Bolotin et al. |
| 6,456,062 B2 * | 9/2002 | Yamashita et al. ......... 324/158.1 |
| 6,462,534 B2 * | 10/2002 | Kang et al. ............... 324/158.1 |
| 6,467,824 B2 | 10/2002 | Bolotin et al. |
| 6,533,589 B1 * | 3/2003 | Palaniappa et al. ........... 439/71 |
| 6,634,847 B1 | 10/2003 | Yeom |
| 6,665,929 B1 | 12/2003 | Bright |
| 6,741,090 B2 * | 5/2004 | Yamashita ................... 324/755 |
| 6,784,657 B2 * | 8/2004 | Fujishiro et al. .......... 324/158.1 |
| 6,877,993 B2 * | 4/2005 | Palaniappa et al. ........... 439/73 |
| 6,925,706 B2 * | 8/2005 | Hwang ........................ 29/740 |

* cited by examiner

*Primary Examiner*—Ha Tran Nguyen
*Assistant Examiner*—Arleen M. Vazquez
(74) *Attorney, Agent, or Firm*—Schwabe, Williamson & Wyatt, P.C.

(57) ABSTRACT

An apparatus, a system, and a method for semiconductor processing automation, specifically for handling, are disclosed herein. In various embodiments, an apparatus for handling comprises a pick-and-place subassembly and a press subassembly.

19 Claims, 3 Drawing Sheets

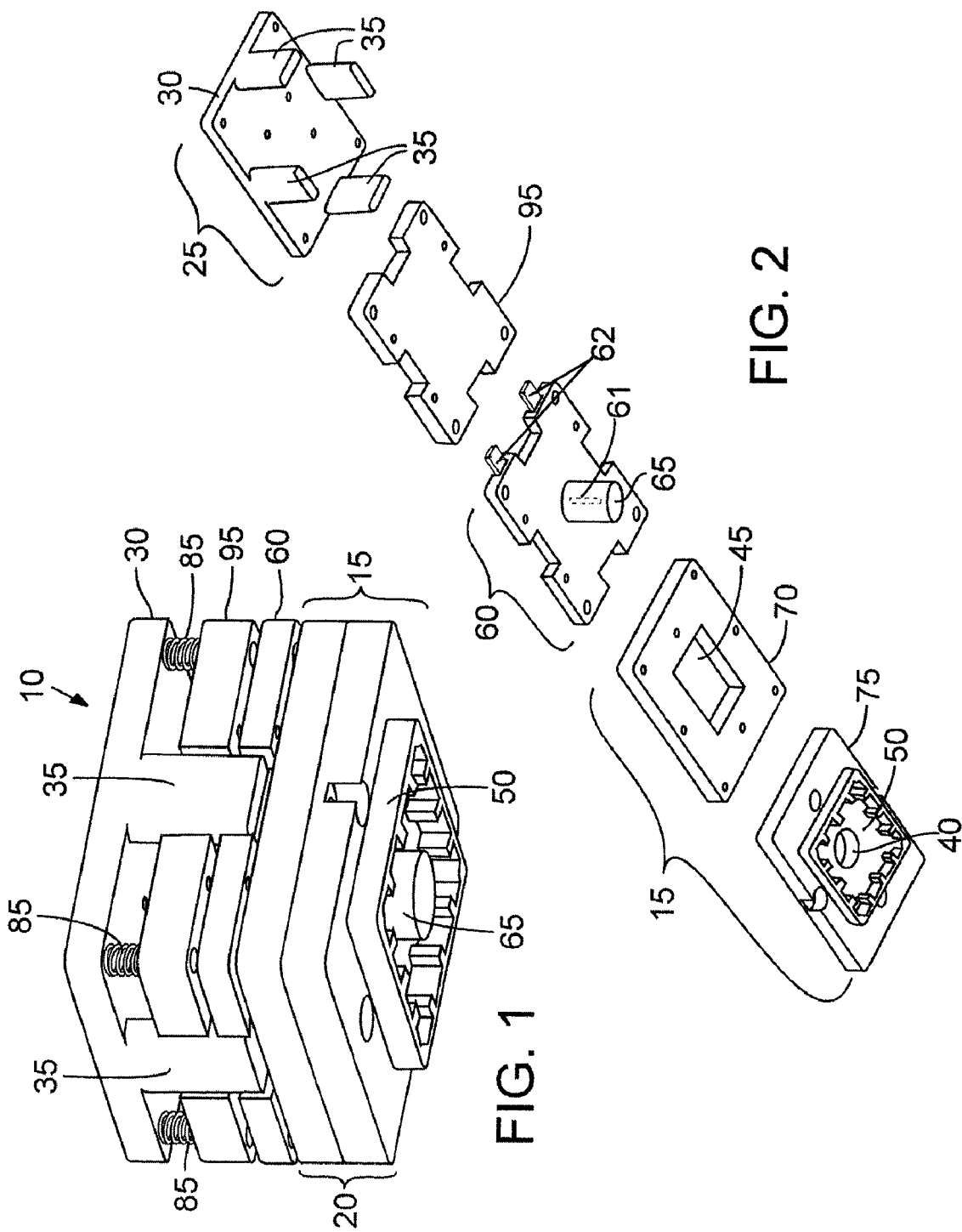

COMBINED PICK, PLACE, AND PRESS APPARATUS

TECHNICAL FIELD

Embodiments of the invention relate generally to the field of semiconductor processing, specifically to methods, apparatuses, and systems associated with handling.

BACKGROUND

As part of the semiconductor manufacturing process, integrated circuits and their associated devices must be tested for a variety of performance characteristics prior to further processing and/or shipping to a customer. These devices are subject, for example, to a number of electrical tests to ensure functionality and reliability.

During the testing stage, various handling and testing equipment are used to transport the devices under test (DUT). Furthermore, there are also various equipment that are used to actually test the DUTs. For example, DUTs must be transported from trays and other holding stations to the testing modules. Typically, a multitude of automated and manual equipment are used to perform individual tasks during DUT testing. One piece of equipment may pick up a DUT and transport it to another location, another piece of equipment may then pick up and place the DUT into a test socket, and yet still another piece of equipment may then push the DUT into the socket. Furthermore, many pick-and-place handlers use suction cups for picking up DUTs. These suction cups are subject to wear and therefore must be maintained and replaced on a periodic basis. Obviously, the vast number and fragility of handling and testing equipment result in a number of problems including reduced space in a testing facility and increased potential for equipment failure, leading to decreased throughput and increased costs.

BRIEF DESCRIPTION OF THE DRAWINGS

Embodiments of the present invention will be readily understood by the following detailed description in conjunction with the accompanying drawings. Embodiments of the invention are illustrated by way of example and not by way of limitation in the figures of the accompanying drawings.

FIG. 1 illustrates a perspective view of a combined pick, place, and press apparatus incorporated with the teachings of the present invention, in accordance with various embodiments;

FIG. 2 illustrates an isometric bottom view of selected disassembled elements of the apparatus of FIG. 1;

DETAILED DESCRIPTION

Figures 3, 4:
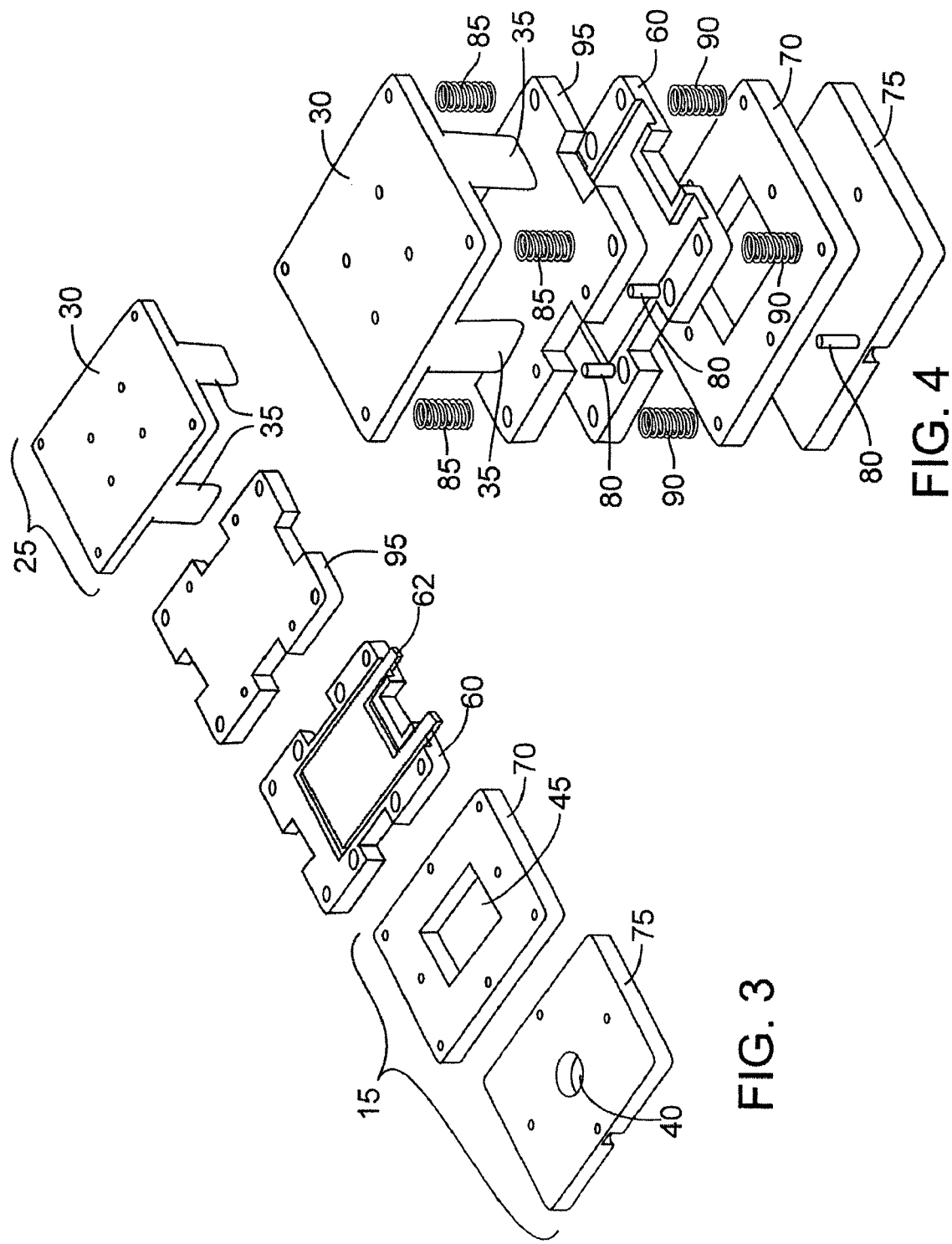
FIG. 3 illustrates an isometric top view of selected disassembled elements of the apparatus of FIG. 1.
FIG. 4 illustrates an exploded view of the apparatus of FIG. 1.

Illustrative embodiments of the present invention include but are not limited to apparatuses, systems, and methods for a combined pick, place, and press apparatus.

In the following detailed description, reference is made to the accompanying drawings which form a part hereof and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent.

The description may use perspective-based descriptions such as up/down, back/front, and top/bottom. Such descriptions are merely used to facilitate the discussion and are not intended to restrict the application of embodiments of the present invention.

The description may use the phrases "in an embodiment," or "in embodiments," which may each refer to one or more of the same or different embodiments. Furthermore, the terms "comprising," "including," "having," and the like, as used with respect to embodiments of the present invention, are synonymous.

The phrase "A/B" means "A or B". The phrase "A and/or B" means "(A), (B), or (A and B)". The phrase "at least one of A, B and C" means "(A), (B), (C), (A and B), (A and C), (B and C) or (A, B and C)". The phrase "(A) B" means "(B) or (A B)", that is, A is optional.

Referring now to FIGS. 1–4, illustrated are perspective and a disassembled views of a combined pick, place, and press apparatus 10 in accordance with various embodiments of the present invention. As illustrated and in accordance with these embodiments, the combined pick, place, and press apparatus 10 may comprise a pick-and-place subassembly 15 having a press base 20 and a press subassembly 25 coupled to the pick-and-place subassembly 15. In these embodiments, the pick-and-place subassembly 15 may be adapted to pick and place a device under test (DUT) onto a socket. Further, in these embodiments, the press subassembly 25 may be adapted to movably exert a force on the DUT, through the press base 20 of the pick-and-place subassembly 15, to enable the DUT to achieve a desired contact with the socket. In the following discussion, embodiments of components in accordance with this invention and operation of embodiments of systems comprising said components will be explained.

In various embodiments, the press subassembly 25 may include a mounting plate 30 and one or more lugs 35 extending in a substantially orthogonal direction from the mounting plate 30. In some of these embodiments and as shown, the lugs 35 of the mounting plate 30 may be disposed along the outer edge of the mounting plate 30 without contacting or interfering with any other subassembly of the combined pick, place, and press apparatus 10. Although the illustrated embodiments portray the lugs 35 as being rectangular in shape, this shape is not required to be in accordance with this invention. For example, one skilled in the art would appreciate that the lugs 35 of the mounting plate 30 may be cylindrical. Furthermore, although the illustrated embodiments portray a mounting plate 30 with four lugs 35, one skilled in the art would also appreciate that the number of lugs 35 may vary and yet remain within the scope of the embodiments in accordance with this invention. In other embodiments, lugs 35 may extend angularly from mounting plate 35.

Still referring to the press subassembly 25, in various embodiments, a pneumatic cylinder or similar device (see FIG. 5, 105) may be removably coupled to the press subassembly 25. In some of these embodiments, the mounting plate 30 may be configured to removably couple to, and receive a force from the pneumatic cylinder or similar device. In these embodiments, the received force from a pneumatic cylinder or similar device may result in the mounting plate 30 to transfer the force through the lugs 35 to a press base 20 of a pick-and-place subassembly 15 of the combined pick, place, and press apparatus 10 for various tasks including, for example, pressing a DUT into a socket and/or thermal monitoring of a DUT.

With respect to the pick-and-place subassembly 15, in some embodiments, the pick-and-place subassembly 15 may have a press base 20 including one or more through-holes 40, 45. In some of these embodiments, the through-hole 40, 45 of the press base 20 may be further adapted to permit one or more contact features to pass through the through-hole, as will be discussed more fully below.

In some embodiments, the pick-and-place subassembly 15 may further include a vacuum chamber 50 having a perimeter and coupled to the press base 20. In various ones of these embodiments, the through-hole 40, 45 of the press base 20 may be disposed within the perimeter of the vacuum chamber 50. Although the vacuum chamber 50 is shown as integrally formed with the pick-and-place subassembly 15, it can be appreciated that within the scope of the embodiments of this invention may be a vacuum chamber 50 separately manufactured and then attached to the pick-and-place subassembly 15. As will also be discussed below, the vacuum chamber 50 may be adapted to couple to a vacuum source to provide a vacuum suction within the vacuum chamber 50 to permit a DUT to adhere to the pick-and-place subassembly 15.

The combined pick, place, and press apparatus 10 may further comprise, in various embodiments, a contact subassembly 60. In various ones of these embodiments, the contact subassembly 60 may be disposed in between and coupled to the pick-and-place subassembly 15 and the press subassembly 25. In some embodiments, the contact subassembly 60 may have one or more protruding contact features 65 designed to movably make contact with a DUT when the press subassembly 25 movably exerts a force on the DUT through the pick-and-place subassembly 15. In these embodiments and as discussed above, the press base 20 of the pick-and-place subassembly 15 may have one or more corresponding through-holes 40, 45 to allow the one or more protruding contact features 65 to make the contact. In various embodiments, the press base 20 of the pick-and-place subassembly 15 may comprise a backing plate 70 and a press plate 75. In these embodiments, the backing plate 70 and the press plate 75 may be coupled and, in these embodiments, may be coupled using any mechanism known in the art. For example, screws 80 may be used. In various embodiments, both the backing plate 70 and the press plate 75 may each have a through-hole 40, 45 to permit one or more of the contact features 65 to pass through the through-holes 40, 45. Furthermore, in certain embodiments, contact feature 65 may be variously sized or shaped, in which case corresponding through-holes 40, 45 would be correspondingly sized or shaped. Further, as discussed above, the pick-and-place subassembly 15 may further include a vacuum chamber 50. In these embodiments, it may be desirable that contact feature 65 and through-holes 40, 45 are correspondingly sized or shaped such to ensure a vacuum suction can be maintained within the vacuum chamber 50.

Still referring to the contact subassembly 60, in various embodiments, the contact subassembly 60 may be coupled to the mounting plate 30 of the press subassembly 25 by one or more first biasing members 85 and the contact subassembly 60 may be further coupled to the pick-and-place subassembly 15 by one or more second biasing members 90. An example of a biasing member in accordance with various embodiments of this invention, and as shown in FIG. 5, may be a spring. In some embodiments, the first biasing members 85 may be adapted to exert a first force and the second biasing members 90 may be adapted to exert a second force, wherein the second force is greater than the first force. In various ones of these embodiments, the second biasing members 90 would cause the contact feature 65 of the contact subassembly 60 to stay retracted away from the DUT when no pressing force is applied to the combined pick, place, and press assembly 10 (by a pneumatic cylinder or similar device, as described earlier). Thus, in these embodiments, the force of the second biasing members 90 must overcome the force of the first biasing members 85 so that the contact feature 65 can retract. However, in these embodiments, when a pressing force is applied to the combined pick, place, and press assembly 10, the second biasing members 90 would be overcome by the pressing force while the first biasing members would cause the contact feature 65 to press against the DUT with the desired amount of force. For example, in some testing situations, the maximum desired force applied to a die disposed on a DUT may be a maximum of about 15 lbs to avoid potential undesirable effects to the die and/or DUT. In those cases, the first biasing members 85 and the second biasing members 90 would be adapted to exert a first and a second force resulting in a net 15 lbs force on the die on the DUT via the contact feature 65. In some test situations, the force required to push a DUT into a socket may need to be at least about 40 lbs in order to effectively push the DUT into the socket. In that case, the first biasing members 85 and the second biasing members 90 may be similarly adapted to exert a first and a second force resulting in a net $\geq$40 lbs on the DUT. In some embodiments, both the force exerted through the contact feature 65 and the force exerted through the press base 20 may be variously adapted so that the desired net force on the DUT and the die on the DUT are achieved. In these embodiments, the first biasing member 85 and the second biasing member 90 may be variously adapted to exert a predetermined desired first force and second force, depending on the desired test conditions. Furthermore, the number of biasing members used may similarly be varied so as to achieve the desired test conditions.

In various embodiments, the contact subassembly 60 may further comprise a temperature-control module 62. For example, in some of these embodiments, temperature-control module 62 may comprise a Peltier device. In some embodiments, temperature-control module 62 may control the temperature of a DUT (or a die on a DUT) when a contact feature 65 of the contact subassembly 60 is in contact with the DUT or the die on a DUT. In various ones of these embodiments, the contact subassembly 60 may further comprise a hot-side radiator plate 95 disposed between the contact subassembly 60 and the mounting plate 30 of the press subassembly 25. In these embodiments, the Peltier device may be disposed between the hot-side radiator plate 95 and the contact subassembly 60. In some embodiments, the hot-side radiator plate 95 and the contact subassembly 60 may be coupled and, in these embodiments, may be coupled using any mechanism known in the art. For example, screws 80 may be used.

In some embodiments, temperature-control module 62 of the contact subassembly 60 may be further coupled to a temperature-monitoring device 61. Temperature-monitoring device 61 may be used, for example, to monitor the temperature of a DUT. In various ones of these embodiments, temperature-monitoring device 61 may be disposed with the contact feature 65 of the contact subassembly 60.

Components in accordance with various embodiments of the present invention may be assembled according to FIG. 4. For clarity, FIG. 2 illustrates an isometric bottom view of selected disassembled elements of combined pick, place, and press apparatus 10 in accordance with various embodiments. Likewise, FIG. 3 illustrates an isometric top view of selected disassembled elements of combined pick, place, and press apparatus 10 in accordance with various embodiments. As shown in these drawings and in accordance with various embodiments, a pick-and-place subassembly 15 may comprise a press plate 75 and a backing plate 70, which may be coupled using screws 80 or any other fastening or attachment mechanism. In some embodiments, the pick-and-place subassembly 15 may then be coupled to a contact subassembly 60 using one or more second biasing members 90. Still further, the contact subassembly 60 may then be coupled to a hot-side radiator plate 95 using screws 80 or any other attachment mechanism. In various embodiments, the hot-side radiator plate 95 may be coupled to a press subassembly 25 using one or more first biasing members 85.

Figure 5A:
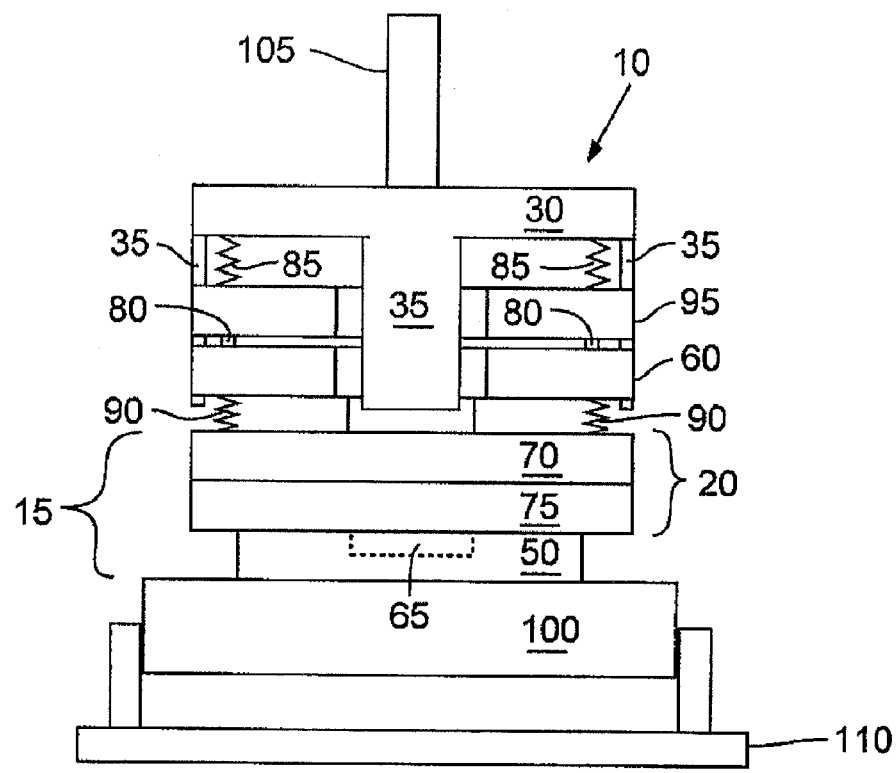
FIG. 5A and FIG. 5B illustrate side views of the apparatus of FIG. 1.
Figure 5B:
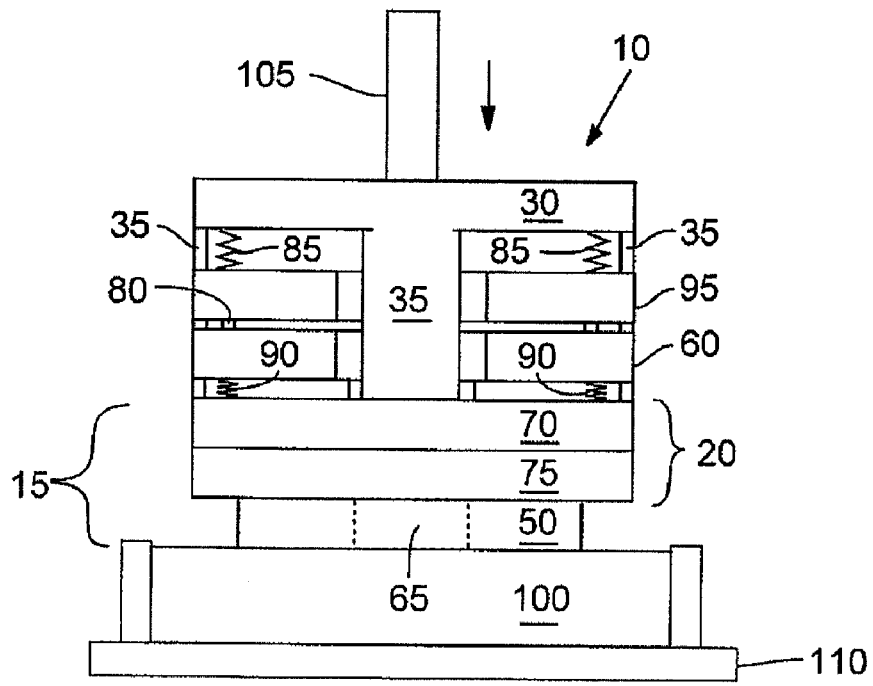

Referring now to FIG. 5A and FIG. 5B, shown are side views of combined pick, place, and press apparatuses 10 in accordance with various embodiments of the present invention. As shown, in these embodiments, a DUT 100 may be picked up by a combined pick, place, and press apparatus 10. Further, in these embodiments, the DUT 100 may be moved by the combined pick, place, and press apparatus 10 to place the DUT 100 on a socket 110 and press the DUT 100 against the socket 110 using the same combined pick, place, and press apparatus 10.

Referring specifically to FIG. 5A, in various embodiments, picking up the DUT 100 may comprise creating a vacuum suction in a vacuum chamber 50 of the pick-and-place subassembly 15 of the combined pick, place, and press apparatus 10. While the combined pick, place, and press apparatus 10 is picking up and moving a DUT 100, a contact feature 65 of the combined pick, place, and press apparatus 10 may be disposed such that the contact feature 65 does not make contact with the DUT 100. As described earlier, one or more first biasing members 85 and one or more second biasing members 90 results in the contact subassembly 60 being suspended away from the DUT 100 when insufficient force is applied to the mounting plate 30. For example, while the DUT 100 is being picked up and moved, little or no pressing force may be applied. Thus, the contact feature 65 does not contact the DUT 100. In contrast, in various embodiments, if the contact feature 65 exerts a pressing force onto a DUT 100 exceeding the vacuum suction, the vacuum seal may be disrupted, causing the DUT 100 to either not adhere or discontinue adhering to the pick-and-place subassembly 15.

Referring now to FIG. 5B, illustrated is an embodiment of a combined pick, place, and press apparatus 10 in accordance with this invention. As shown, the combined pick, place, and press apparatus 10 is pressing the DUT 100 against a socket 110. In various ones of these embodiments, pressing the DUT 100 against the socket 110 using the combined pick, place, and press apparatus 10 may comprise moving the press subassembly 25 of the combined pick, place, and press apparatus 10 to exert a force onto the DUT 100 through the combined pick, place, and press apparatus 10. In these embodiments, moving the press subassembly 25 to exert a force onto the DUT 100 may comprise the mounting plate 30 receiving a force from a pneumatic cylinder 105 or similar device and transferring the force through one or more lugs 35 to a press base 20 of a pick-and-place subassembly 15. In various other embodiments and as shown, pressing the DUT 100 against the socket may comprise concurrently moving one or more contact features 65 of a contact subassembly 60 to contact the DUT 100. As described earlier, contacting the DUT 100 with a contact feature 65 may be performed to control and/or monitor the temperature of the DUT 100 (or a die on the DUT 100).

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. An apparatus comprising:
   a pick-and-place subassembly adapted to pick and place a device under test (DUT) onto a socket, with the pick-and-place subassembly having a press base;
   a press subassembly coupled to the pick-and-place subassembly, including a mounting plate and one or more lugs extending orthogonally from the mounting plate, with the mounting plate configured to receive a force and the lugs configured to transfer the force orthogonally to a first surface of the press base, to enable the DUT, disposed adjacent to a second surface of the press base opposite the first surface, to achieve a desired contact with the socket;
   a contact subassembly disposed in between and coupled to the pick-and-place subassembly and the press subassembly, the contact subassembly having one or more protruding contact features designed to movably make contact with the DUT when the press subassembly movably exerts a force on the DUT through the pick-and-place subassembly, the press base of the pick-and-place subassembly having one or more corresponding through-holes to allow the one or more protruding contact features to make the contact.

2. The apparatus of claim 1, wherein the mounting plate is further configured to removably couple to, and receive a force from a pneumatic cylinder.

3. The apparatus of claim 1, wherein the mounting plate is coupled to the contact subassembly by one or more first biasing members, and wherein the contact subassembly is coupled to the pick-and-place subassembly by one or more second biasing members.

4. The apparatus of claim 3, wherein the first biasing members are adapted to exert a first force and the second biasing members are adapted to exert a second force, wherein the second force is greater than the first force.

5. The apparatus of claim 4, wherein the first force and the second force are adapted to cause the contact feature to exert a net force of no more than 15 pounds-force when the press subassembly receives a pressing force, and further adapted to cause the pick-and-place subassembly to exert a net force of at least 40 pounds-force when the press subassembly receives the pressing force.

6. The apparatus of claim 3, wherein one or more of the biasing members is a spring.

7. The apparatus of claim 1, wherein the contact subassembly further comprises a temperature-control module.

8. The apparatus of claim 7, wherein the temperature-control module comprises a Peltier device.

9. The apparatus of claim 8, further comprising a hot-side radiator plate disposed between the mounting plate and the contact subassembly, and wherein the Peltier device is disposed between the hot-side radiator plate and the contact subassembly.

10. The apparatus of claim 7, wherein the temperature-control module is further coupled to a temperature-monitoring device, the temperature-monitoring device disposed within the contact feature.

11. The apparatus of claim 1, wherein the press base comprises:
   a backing plate having a through-hole to permit one or more of the contact features to pass through the through-hole of the backing plate; and
   a press plate having a through-hole to permit one or more of the contact features to pass through the through-hole of the press plate.

12. The apparatus of claim 1, wherein the press base includes one or more through-holes, and the pick-and-place subassembly further includes a vacuum chamber, having a perimeter and coupled to the press base, with the through-hole of the press base being disposed within the perimeter of the vacuum chamber.

13. A system comprising:
   a test apparatus, having:
      a pick-and-place subassembly adapted to pick and place a device under test (DUT) onto a socket, with the pick-and-place subassembly having a press base;
      a press subassembly coupled to the pick-and-place subassembly, including a mounting plate and one or more lugs extending orthogonally from the mounting plate, with the mounting plate configured to receive a force and the lugs configured to transfer the force orthogonally to a first surface of the press base, to enable a second surface of the DUT, disposed adjacent to a second surface of the press base opposite the first surface, to achieve a desired contact with the socket; and
      a contact subassembly disposed in between and coupled to the pick-and-place subassembly and the press subassembly, the contact subassembly having one or more protruding contact features designed to movably make contact with the DUT when the press subassembly movably exerts a force on the DUT through the pick-and-place subassembly, the press base of the pick-and-place subassembly having one or more corresponding through-holes to allow the one or more protruding contact features to make the contact; and
   a pneumatic cylinder removably coupled to the press subassembly of the test apparatus.

14. The system of claim 13, further comprising a temperature-control module to control the temperature of the contact subassembly.

15. The system of claim 14, wherein the temperature-control module comprises a Peltier device.

16. The system of claim 13, further comprising a temperature-monitoring device to monitor the temperature of a DUT.

17. The system of claim 13, wherein the pick-and-place subassembly includes a vacuum chamber, and the system further comprising a vacuum source adapted to provide a vacuum suction within the vacuum chamber to permit a DUT to adhere to the pick-and-place subassembly.

18. The system of claim 13, wherein the contact subassembly is adapted to exert no greater than 15 pounds-force upon a die of the DUT.

19. The system of claim 13, wherein the press subassembly is adapted to exert at least 40 pounds-force upon a DUT.

* * * * *